United States Patent
So et al.

(10) Patent No.: US 9,985,153 B2
(45) Date of Patent: May 29, 2018

(54) AIR STABLE INFRARED PHOTODETECTORS FROM SOLUTION-PROCESSED INORGANIC SEMICONDUCTORS

(71) Applicant: University of Florida Research Foundation, Incorporated, Gainesville, FL (US)

(72) Inventors: Franky So, Cary, NC (US); Jesse Robert Manders, Mountain View, CA (US); Song Chen, Guangzhou (CN); Erik D. Klump, Gainesville, FL (US); Tzhung-Han Lai, Gainesville, FL (US); Sai-Wing Tsang, Hong Kong (CN)

(73) Assignee: University of Florida Research Foundation, Incorporated, Gainesville, FL (US)

( * ) Notice: Subject to any disclaimer, the term of this patent is extended or adjusted under 35 U.S.C. 154(b) by 0 days. days.

(21) Appl. No.: 14/915,426

(22) PCT Filed: Aug. 29, 2014

(86) PCT No.: PCT/US2014/053546
§ 371 (c)(1),
(2) Date: Feb. 29, 2016

(87) PCT Pub. No.: WO2015/031835
PCT Pub. Date: Mar. 5, 2015

(65) Prior Publication Data
US 2016/0211392 A1    Jul. 21, 2016

Related U.S. Application Data

(60) Provisional application No. 61/871,579, filed on Aug. 29, 2013.

(51) Int. Cl.
*H01L 31/107* (2006.01)
*H01L 31/0352* (2006.01)
(Continued)

(52) U.S. Cl.
CPC .. *H01L 31/035218* (2013.01); *H01L 31/0296* (2013.01); *H01L 31/02165* (2013.01);
(Continued)

(58) Field of Classification Search
CPC ...... H01L 29/15; H01L 21/18; H01L 31/0352
(Continued)

(56) References Cited

U.S. PATENT DOCUMENTS 5,401,970 A * 3/1995 Kinsey ................ G01J 1/429
250/372
2009/0108745 A1    4/2009 Koshiyama
(Continued)

FOREIGN PATENT DOCUMENTS

CN    102160188 A    8/2011
CN    102165572 A    8/2011
(Continued)

OTHER PUBLICATIONS

International Search and Written Opinion dated Dec. 18, 2014 for Application No. PCT/US2014/053546.
(Continued)

*Primary Examiner* — Tan N Tran
(74) *Attorney, Agent, or Firm* — Wolf, Greenfield & Sacks, P.C.

(57) ABSTRACT

A photodetector has a photoactive layer of semiconducting inorganic nanoparticles positioned between a hole transport electron blocking layer of a first metal oxide and an electron transport hole blocking layer of a second metal oxide. The nanoparticles are responsive to electromagnetic radiation in at least the infrared region of the spectrum. The first metal
(Continued)

oxide can be NiO, and the second metal oxide can be ZnO or TiO$_2$. The metal oxide layers render the photodetector stable in air, even in the absence of an encapsulating coating around the photodetector. The photodetector has a P-I-N structure.

27 Claims, 8 Drawing Sheets

(51) Int. Cl.
    *H01L 31/0296*     (2006.01)
    *H01L 31/032*     (2006.01)
    *H01L 31/101*     (2006.01)
    *H01L 31/0216*     (2014.01)
    *H01L 31/109*     (2006.01)
    *H01L 31/18*     (2006.01)
    *H01L 31/105*     (2006.01)
    *B82Y 20/00*     (2011.01)
    *B82Y 40/00*     (2011.01)

(52) U.S. Cl.
    CPC ........ *H01L 31/0324* (2013.01); *H01L 31/101* (2013.01); *H01L 31/105* (2013.01); *H01L 31/109* (2013.01); *H01L 31/18* (2013.01); *B82Y 20/00* (2013.01); *B82Y 40/00* (2013.01); *Y10S 977/774* (2013.01); *Y10S 977/813* (2013.01); *Y10S 977/893* (2013.01); *Y10S 977/954* (2013.01)

(58) Field of Classification Search
    USPC .................. 257/186, 293, E33.076, E31.115
    See application file for complete search history.

(56) References Cited

U.S. PATENT DOCUMENTS

| | | | |
|---|---|---|---|
| 2011/0101479 A1* | 5/2011 | Arango | ............... H01L 31/0352 257/431 |
| 2012/0138901 A1 | 6/2012 | Walker et al. | |
| 2012/0241723 A1* | 9/2012 | Klem | ..................... B82Y 10/00 257/21 |
| 2013/0001520 A1* | 1/2013 | Sargent | .................. B82Y 20/00 257/40 |

FOREIGN PATENT DOCUMENTS

| | | |
|---|---|---|
| CN | 103069604 A | 4/2013 |
| GB | 2 486 203 A | 6/2012 |
| WO | WO 2009/103124 A1 | 8/2009 |

OTHER PUBLICATIONS

International Preliminary Report on Patentability dated Mar. 10, 2016 for Application No. PCT/US2014/053546.

Konstantatos et al., Solution-Processed Quantum Dot Photodetectors. Proc IEEE. Oct. 2009;97(10):1666-83.

McDonald et al., Solution-processed PbS quantum dot infrared photodetectors and photovoltaics. Nature Mater. Feb. 2005;4:138-42. doi:10.1038/nmat1299. Supplemental Figure. 1 page.

Extended European Search Report dated May 22, 2017 for Application No. EP 14840121.9.

* cited by examiner

Lead Sulfide QDs

Zinc Oxide NPs

US 9,985,153 B2

AIR STABLE INFRARED PHOTODETECTORS FROM SOLUTION-PROCESSED INORGANIC SEMICONDUCTORS

RELATED APPLICATIONS

The present application is a U.S. national stage filing under 35 U.S.C. § 371 based on International Application No. PCT/US2014/053546, filed Aug. 29, 2014, which claims priority under 35 U.S.C. § 119(e) to U.S. Provisional Application Ser. No. 61/871,579, filed Aug. 29, 2013, each of which is hereby incorporated by reference herein in its entirety, including any figures, tables, or drawings.

BACKGROUND OF INVENTION

Optical communications, remote sensing, spectroscopy, optoelectronics and imaging are just a few of the applications enabled by infrared and broadband photodetectors. In these photodetectors, a photosensitive material absorbs optical signals in the visible range and/or short wavelength infrared (SWIR) range and transforms the optical signals into electronic signals. Conventional photodetectors are typically made under vacuum processing conditions that are incompatible with high throughput, inexpensive fabrication techniques. The market penetration of the photodetectors is limited due to the high fabrication cost and/or low performance of the photodetectors. Recently, efforts have been made to address the high fabrication costs by the development of devices that can be prepared by solution processes.

Colloidal quantum dots are attractive as a material for a range of optoelectronic devices, including photodetectors, as colloidal quantum dots are solution processable, which expands the type of substrates that can be used, including integrated circuits. By their nature, quantum dots can be tuned in size to achieve a desired optical absorption spectrum. This permits the formation of thin-film photodetectors, which constitute a low cost, lightweight, flexible platform. Conventional single-crystalline semiconductors are precluded from integration with flexible electronics, particularly those including organic materials, due to the incompatibility of the processing conditions required for the semiconductors. Solutions, or suspensions, of colloidal quantum dots allow deposition using spin-coating, spray-casting, or inkjet printing techniques on virtually any substrate. Lattice mismatch considerations do not arise, and flexible substrates allow large-area processing.

Some efforts have been made to employ quantum dots in photodetectors. Konstantatos et al., *Proceedings of the IEEE* 2009, 97, (10), 1666-83, discloses the formation of photodetectors by the solution deposition of PbS quantum dots. Photodiodes were formed between a PbS nanocrystal film and an aluminum contact, with a planar transparent ITO thin film forming the opposing ohmic contact. MacDonald et al., *Nature Materials* 2005, 4, 138-42 discloses a solution processable device where a sandwich structure of glass, indium tin oxide (ITO), poly(p-phenylenevinylene) (PPV), MEH-PPV/PbS nanocrystal blend, and an upper magnesium contact is formed. In addition to acting as a hole transport layer, the PPV layer provides better electrical stability by forming a smooth and pinhole-free pre-layer on which the blend films are cast, eliminating catastrophic shorts from the upper contact directly through to the ITO, decreases the dark current by introducing an injection barrier at the ITO contact, increases the ratios of photocurrent to dark current, and permits a higher bias before electrical breakdown, resulting in a higher internal field, more efficient photogenerated carrier extraction, and higher photocurrents.

BRIEF SUMMARY

Embodiments of the invention are directed to photodetectors that comprise a photoactive layer of semiconducting inorganic nanoparticles positioned between a hole transport layer comprising a first metal oxide and an electron transport layer comprising a second metal oxide. The photoactive layer can be responsive to electromagnetic radiation in the infrared (IR) region of the spectrum and/or higher energy electromagnetic radiation. The metal oxide coatings can provide low noise and stability in air without encapsulation. The hole transport layer can comprise NiO and/or CuO. The electron transport layer can comprise ZnO or $TiO_2$. The semiconducting inorganic nanoparticles can comprise lead chalcogenides (e.g., PbS, PbSe), alloys of lead chalcogenides, mercury chalcogenides (e.g., HgS, HgSe, HgTe), alloys of mercury chalcogenides, III-V semiconductors based on indium and/or gallium (e.g., GaN, GaP, GaAs, InP), silicon, or any combinations thereof. The semiconducting inorganic nanoparticles can be PbS or PbSe. In some embodiments, the photodetector can be a broadband photodetector that is responsive to electromagnetic radiation in at least the visible and infrared regions of the electromagnetic spectrum. Nanoparticles that are responsive to electromagnetic radiation in the ultraviolet and/or visible regions of the electromagnetic spectrum can be used. For example, non-limiting examples of suitable nanoparticles include cadmium selenide, cadmium sulfide, and zinc selenide.

Other embodiments of the invention are directed to a method of preparing the photodetector. In some cases, a solution of a metal oxide precursor or a suspension of metal oxide nanoparticles is deposited on an electrode, and the solvent is removed to form a metal oxide layer. The metal oxide layer can be modified chemically or thermally to fix and/or enhance the electrical properties of the layer. A colloidal suspension of semiconducting inorganic nanoparticles can then be deposited on the metal oxide layer, and the solvent can be removed to form a photoactive layer comprising semiconducting inorganic nanoparticles. The photoactive layer can be modified chemically or thermally, as desired, for example by ligand exchange. A second solution of a second metal oxide precursor or a second suspension of a plurality of second metal oxide particles can be deposited on the photoactive layer, and the solvent can be removed to form a second metal oxide layer, which can also be modified chemically or thermally. When the electrode is an anode, the first metal oxide layer is a hole transport electron blocking layer, and the second metal oxide layer is an electron transport hole blocking layer. When the electrode is a cathode, the first metal oxide layer is an electron transport hole blocking layer, and the second metal oxide layer is a hole transport electron blocking layer.

V, or −3 V for an exemplary PbS photodetector with solution-processed nickel oxide hole transport electron blocking and zinc oxide electron transport hole blocking layers, according to an embodiment of the invention, where 20 depositions of PbS layers sequentially resulted in a combined thick photoactive layer.

Figure 3:
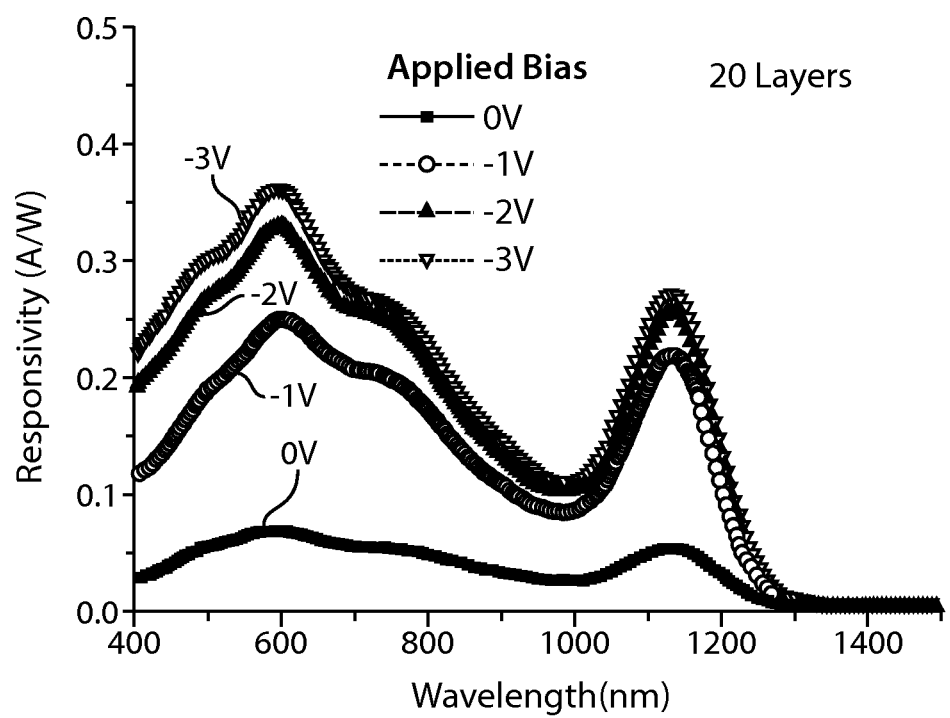
FIG. 3 shows plots of responsivity as a function of wavelength under an applied bias voltage of 0 V, −1 V, −2
Figure 4:
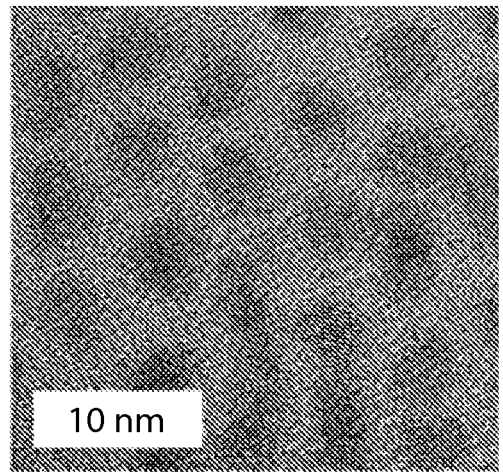

FIG. 4 is an electron micrograph of about 6 nm PbS quantum dots used for preparation of the exemplary PbS photodetector of FIG. 3, according to an embodiment of the invention.

Figure 5:
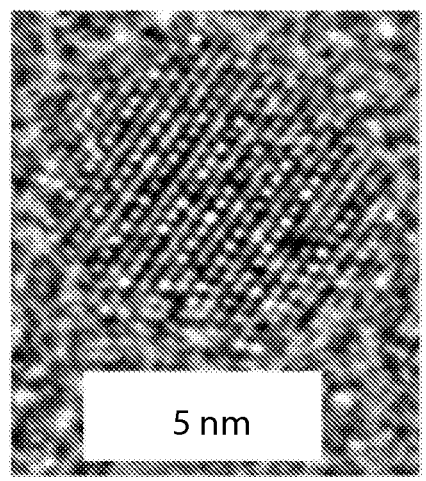

FIG. 5 is an electron micrograph of about 6 nm ZnO nanoparticles used for preparation of the exemplary PbS photodetector of FIG. 3, according to an embodiment of the invention.

Figure 6A:
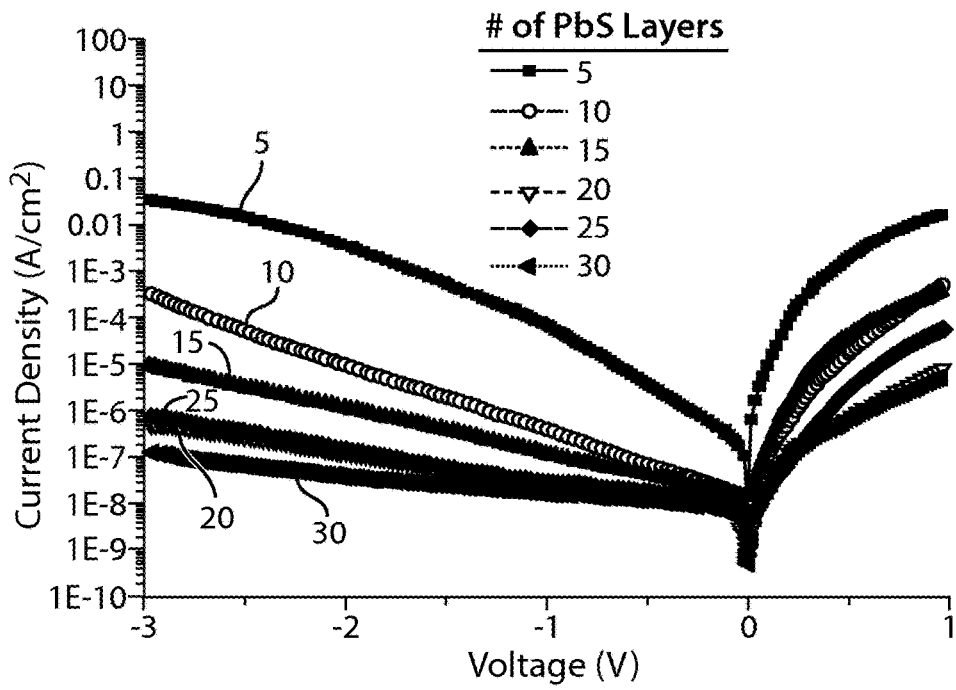
Figure 6B:
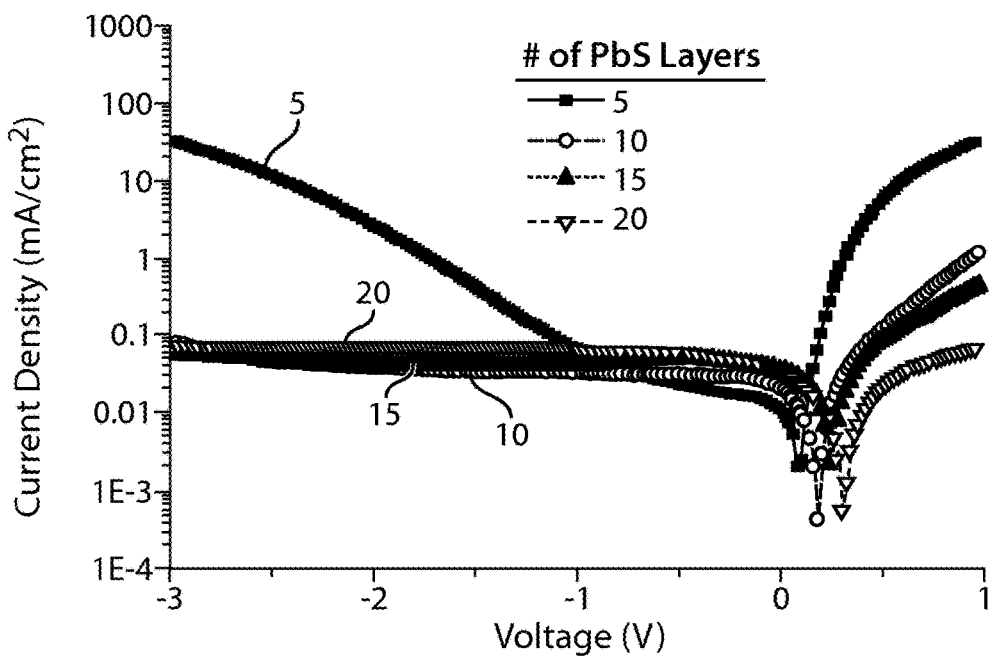

FIG. 6 shows plots of A) dark and B) illuminated current-voltage characteristics of PbS photodetectors with solution-processed nickel oxide hole transport electron blocking and zinc oxide electron transport hole blocking layers, according to an embodiment of the invention, where the thickness of the PbS photoactive layer was varied by combining 5, 10, 15, 20, 25, or 30 PbS layers.

Figure 7A:
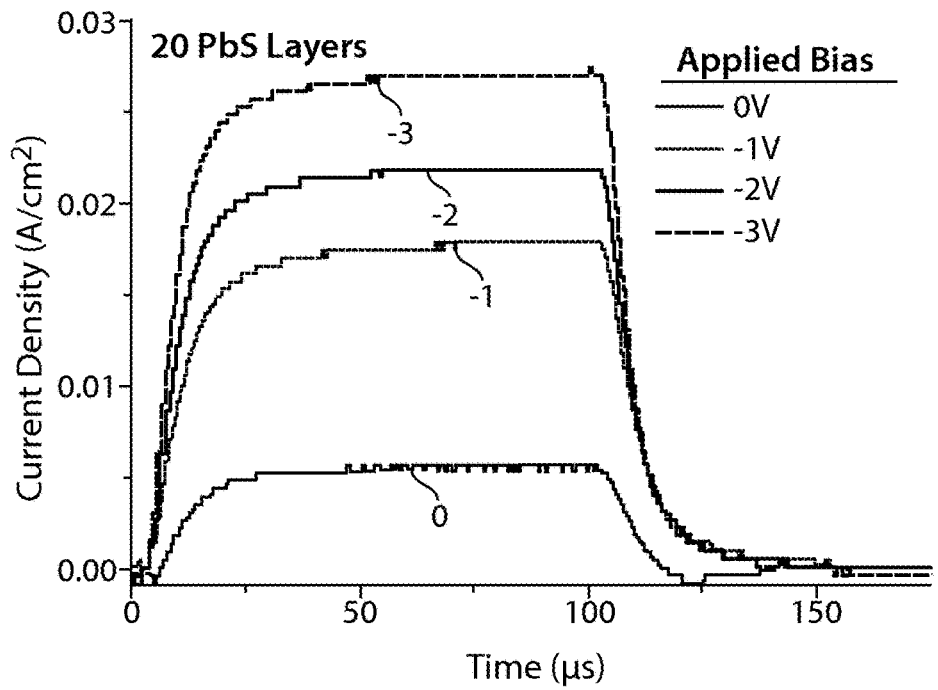
Figure 7B:
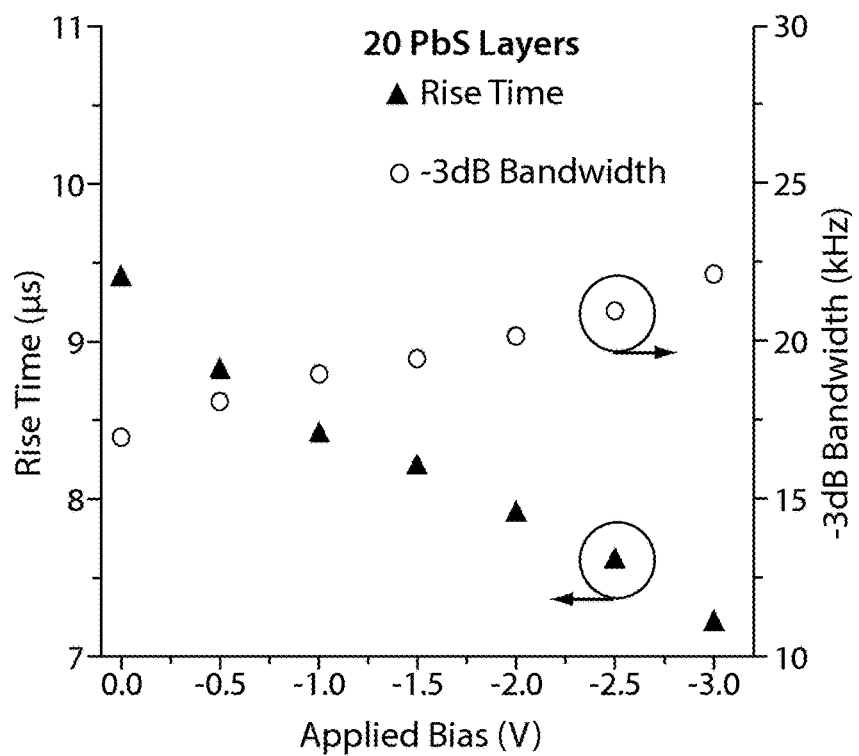

FIG. 7 shows plots of A) speed (e.g., current density as a function of time under an applied bias voltage of 0 V, −1 V, −2 V, or −3 V) and B) bandwidth measurements (e.g., −3 dB bandwidth as a function of applied bias) and rise time measurements (e.g., rise time as a function of applied bias) taken for the exemplary PbS photodetector of FIG. 3, according to an embodiment of the invention.

Figure 8:
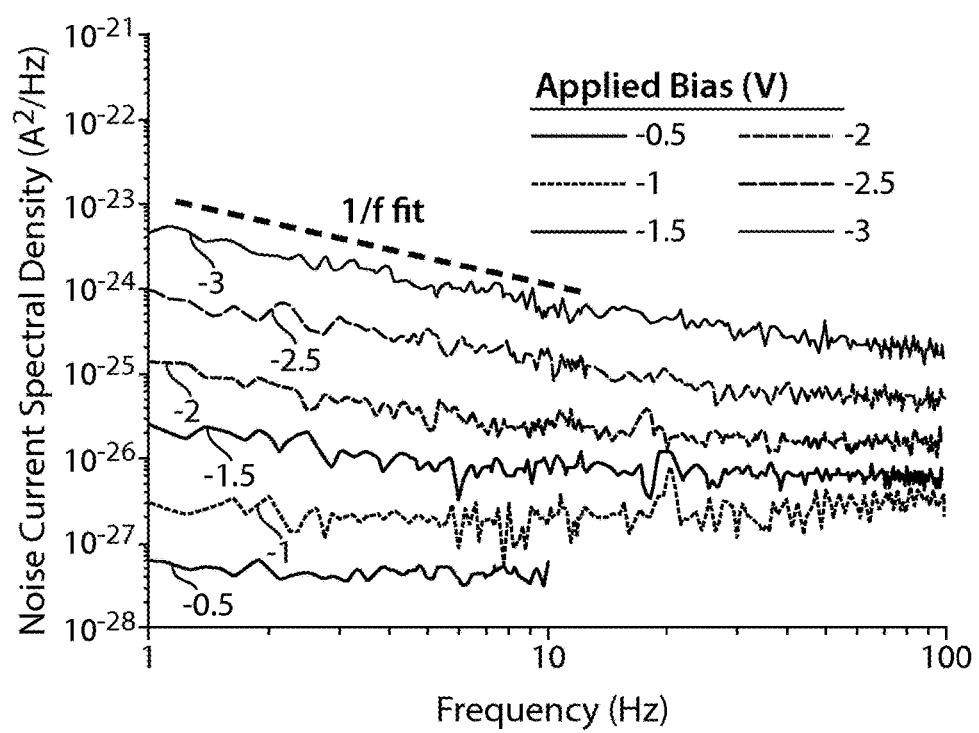

FIG. 8 shows plots of noise current spectral density as a function of frequency under an applied bias voltage of −0.5 V, −1 V, −1.5 V, −2 V, −2.5 V, or −3 V for the exemplary PbS photodetector of FIG. 3, according to an embodiment of the invention.

Figure 9:
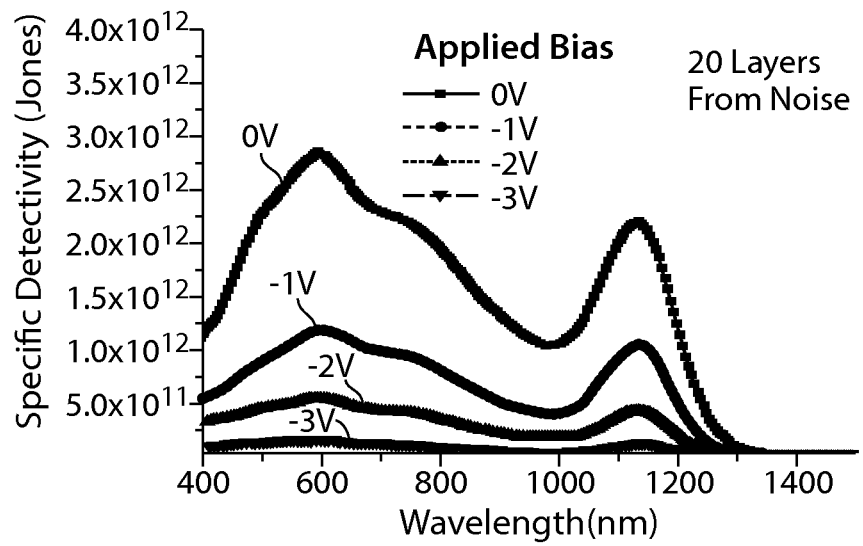

FIG. 9 shows plots of specific detectivities as a function of wavelength under an applied bias voltage of 0 V, −1 V, −2 V, or −3 V for the exemplary PbS photodetector of FIG. 3, according to an embodiment of the invention.

Figure 10:
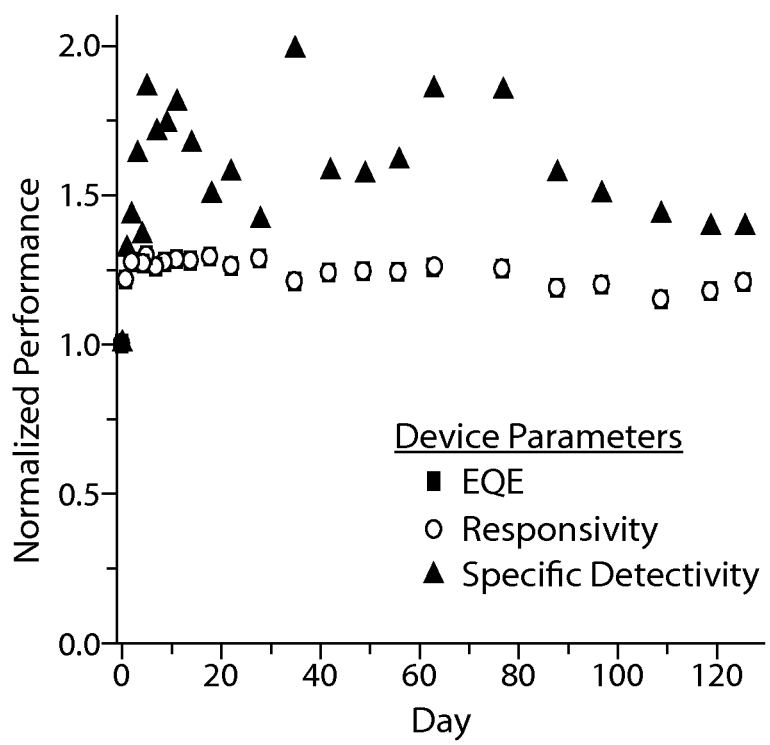

FIG. 10 shows a plot of normalized performance parameters (e.g., external quantum efficiency, responsivity, specific detectivity) as a function of time for the exemplary PbS photodetector of FIG. 3, according to an embodiment of the invention, which reflects the air stability of the PbS photodetector without any encapsulation and in contact with air throughout the lifetime test, where the specific detectivity is determined using the following approximation of total noise current: $\langle i^2 \rangle = 2qI_{dark}$.

DETAILED DISCLOSURE

The inventors have recognized and appreciated the desirability of a photodetector that is air-stable in the absence of an external encapsulating coating. The inventors have also recognized and appreciated the desirability of a photodetector that can be fabricated through solution processes. Further, the inventors have recognized and appreciated designs for devices with these characteristics and methods to make and use them.

An embodiment of the invention is directed to a photodetector comprising a photoactive layer comprising an inorganic material, where the photoactive layer is positioned between a hole transport layer comprising a first metal oxide and an electron transport layer comprising a second metal oxide. A photoactive layer generally refers to a layer comprising a material that is capable of absorbing electromagnetic radiation and generating charge carriers (e.g., holes, electrons). As described in further detail herein, a hole transport layer generally refers to a layer that facilitates hole transport between two or more layers of a device (e.g., a photodetector), and an electron transport layer generally refers to a layer that facilitates electron transport between two or more layers of a device (e.g., a photodetector). The photodetector is, generally, an infrared and/or visible photodetector, where the photoactive layer absorbs electromagnetic radiation including at least a portion of the electromagnetic spectrum, for example, having a wavelength between 400 and 7,000 nm. The photodetector can, in some cases, comprise infrared-sensitive nanoparticles. In some embodiments, the photodetector has a P-I-N structure (e.g., P-I-N junction). The P-I-N structure may generally refer to a structure comprising a p-type semiconductor region, an n-type semiconductor region, and an intrinsic semiconductor region positioned between the p-type and n-type regions. For example, one metal oxide layer may constitute a p-type semiconductor region, another metal oxide layer may constitute an n-type semiconductor region, and the photoactive layer may constitute an intrinsic semiconductor region positioned between the p-type and n-type regions. Another embodiment of the invention is directed to an all-solution method for forming the metal oxide layers and the photoactive layer of the photodetectors described herein.

As described in further detail below, the photodetectors described herein may have certain properties that have been recognized to be advantageous. For example, a photodetector may be air-stable in the absence of an external encapsulating coating (e.g., the performance of a photodetector exposed to air may be relatively stable over a period of time). Additionally, a photodetector may exhibit certain other characteristics that have been recognized to be advantageous, such as high detectivity, high external quantum efficiency, and/or high responsivity.

Figure 1A:
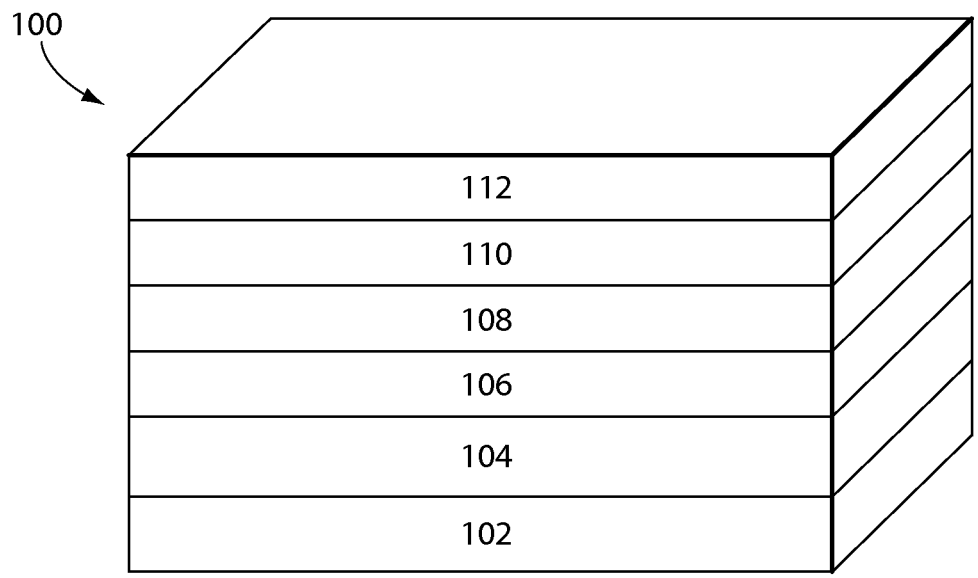
FIG. 1 shows: A) a photodetector having a standard architecture; and B) a photodetector having an inverted architecture, according to embodiments of the invention.

In some embodiments, the photodetector has a standard, or regular, architecture. An exemplary schematic illustration of a photodetector having a standard architecture is shown in FIG. 1A. In FIG. 1A, photodetector 100 is a multi-layered structure including a substrate 102, an anode 104, a hole transport layer 106, a photoactive layer 108, an electron transport layer 110, and a cathode 112. In operation, a reverse bias voltage may be applied to photodetector 100. In some embodiments, the magnitude of the reverse bias voltage may be at least about 0 V, at least about 1 V, at least about 2 V, at least about 3 V, at least about 4 V, at least about 5 V, at least about 6 V, at least about 8 V, or at least about 10 V. In certain cases, the magnitude of the reverse bias voltage is in the range of about 0 V to about 2 V, about 0 V to about 3 V, about 0 V to about 5 V, about 0 V to about 10 V, about 1 V to about 2 V, about 1 V to about 5 V, about 1 V to about 10 V, about 2 V to about 5 V, about 2 V to about 10 V, or about 5 V to about 10 V. Electromagnetic radiation may enter photodetector 100 through substrate 102 and pass through anode 104 and hole transport layer 106. The electromagnetic radiation may then excite electrons in photoactive layer 108, resulting in the generation of free electron-hole pairs. The electrons may subsequently be transported through electron transport layer 110 to cathode 112, while the holes may be transported through hole transport layer 106 to anode 104, thereby producing a measurable photocurrent.

As shown in FIG. 1A, photodetector 100 may comprise a photoactive layer 108. In some embodiments, the photoactive layer of the photodetector comprises inorganic nanoparticles that are capable of absorbing infrared radiation (e.g., radiation having a wavelength in the range of about 700 nm to about 1 mm). In some embodiments, the inorganic nanoparticles are capable of absorbing radiation having a wavelength of at least about 700 nm, at least about 800 nm, at least about 1 µm, at least about 1.5 µm, at least about 2 µm, at least about 3 µm, at least about 4 µm, at least about 5 µm, or at least about 7 µm. In some embodiments, the inorganic nanoparticles are capable of absorbing radiation having a wavelength in the range of about 700 nm to about 1 µm, about 700 nm to about 1.5 µm, about 700 nm to about 2 µm, about 700 nm to about 4 µm, about 700 nm to about 7 µm, about 700 nm to about 14 µm, about 800 nm to about 2 µm, about 800 nm to about 4 µm, about 800 nm to about 7 µm, about 800 nm to about 14 µm, about 1 µm to about 3 µm, about 1 µm to about 4 µm, about 1 µm to about 7 µm, about 1 µm to about 14 µm, about 2 µm to about 4 µm, about 2 µm to about 7 µm, about 2 µm to about 14 µm, or about 5 µm to about 14 µm. Suitable materials for the nanoparticles include, but are not limited to, lead chalcogenides (e.g., PbS, PbSe) and alloys thereof; mercury-based chalcogenides (HgS, HgSe, HgTe) and alloys thereof; III-V semiconductors based on indium and/or gallium (e.g., GaN, GaP, GaAs, InP); silicon; silver chalcogenides (e.g., $Ag_2S$, $Ag_2Se$, $Ag_2Te$); or combinations thereof. In certain embodiments, the nanoparticles comprise PbS and/or PbSe.

In some embodiments, the photoactive layer comprises inorganic nanoparticles that are capable of absorbing visible light (e.g., radiation having a wavelength in the range of about 400 nm to about 700 nm) and/or ultraviolet (UV) radiation (e.g., radiation having a wavelength of less than about 400 nm). In some embodiments, the inorganic nanoparticles are capable of absorbing light having a wavelength in the range of about 200 nm to about 400 nm, about 200 nm to about 700 nm, about 200 nm to about 1 µm, about 200 nm to about 2 µm, about 400 nm to about 700 nm, about 400 nm to about 1 µm, about 400 nm to about 1.3 µm, or about 400 nm to about 2 µm. In some embodiments, the inorganic nanoparticles of the photoactive layer may comprise cadmium and/or zinc compounds. Non-limiting examples of suitable cadmium and/or zinc compounds include cadmium selenide, cadmium sulfide, and zinc selenide.

The inorganic nanoparticles of the photoactive layer may be relatively small in size. In some embodiments, the nanoparticles have a largest cross-sectional dimension (e.g., diameter) of about 100 nm or less, about 50 nm or less, about 20 nm or less, about 10 nm or less, about 8 nm or less, about 6 nm or less, about 4 nm or less, or about 1 nm. In some embodiments, the nanoparticles have a diameter in the range of about 1 nm to about 5 nm, about 1 nm to about 10 nm, about 1 nm to about 20 nm, about 1 nm to about 50 nm, about 1 nm to about 100 nm, about 4 nm to about 10 nm, about 4 nm to about 20 nm, about 5 nm to about 10 nm, about 5 nm to about 20 nm, about 5 nm to about 50 nm, about 5 nm to about 100 nm, about 6 nm to about 10 nm, about 6 nm to about 20 nm, about 10 nm to about 50 nm, about 10 nm to about 100 nm, or about 50 nm to about 100 nm.

In certain cases, the nanoparticles are nanocrystals (e.g., crystalline particles having a largest cross-sectional dimension of about 100 nm or less). In particular embodiments, the nanoparticles are quantum dots. Quantum dots generally refer to semiconducting nanoparticles (e.g., nanocrystals) that have a sufficiently small size to exhibit quantum mechanical properties (e.g., discrete energy levels). For example, the excitons of quantum dots may be confined in three spatial dimensions (e.g., quantum confinement), and discrete energy levels may be observed. In some cases, quantum dots have a largest cross-sectional dimension (e.g., diameter) of about 10 nm or less, about 8 nm or less, about 6 nm or less, about 4 nm or less, or about 1 nm or less. In certain embodiments, the quantum dots have a largest cross-sectional dimension in the range of about 1 nm to about 4 nm, about 1 nm to about 6 nm, about 1 nm to about 8 nm, about 1 nm to about 10 nm, about 4 nm to about 6 nm, about 4 nm to about 8 nm, about 4 nm to about 10 nm, about 6 nm to about 8 nm, about 6 nm to about 10 nm, or about 8 nm to about 10 nm.

Quantum dots permit tuning to a desired spectral absorption, as the absorption properties of quantum dots are generally dependent on their size. For example, a larger quantum dot may absorb electromagnetic radiation having a longer wavelength. In some cases, quantum dots may be tuned to absorb a wide spectral band, for example by making synthetic modifications that determine the size and size distribution of the quantum dots that are prepared and/or by combining different sized or different composition nanocrystals from various syntheses. These semiconductor quantum dots may allow preparation of photodetectors with very low dark current in reverse bias, which, because of the low noise level, results in the ability to detect a low-level signal with a high signal-to-noise ratio. Additionally, the semiconductor quantum dots may advantageously be synthesized through colloidal synthesis and may be deposited during preparation of the photodetectors by solution processes.

As shown in FIG. 1A, photodetector 100 may further comprise a layer 106 positioned adjacent photoactive layer 108. In some embodiments, layer 106 comprises a first metal oxide (e.g., a first metal oxide layer). The first metal oxide layer may, in certain cases, be a hole transport layer (e.g., the first metal oxide may be a hole transporting material). A hole transport layer generally refers to a layer that facilitates hole transport between two or more layers of a device (e.g., a photodetector). For example, when photodetector 100 is in operation, hole transport layer 106 may facilitate the transport of holes from photoactive layer 108 to anode 104. Hole transport layer 106, photoactive layer 108, and electron transport layer 110 may each be characterized by a valence band (e.g., a highest occupied energy level) having a valence band energy (e.g., ionization potential) and a conduction band (e.g., a lowest unoccupied energy level) having a conduction band energy (e.g., electron affinity). In some cases, hole transport layer 106 may facilitate transport of holes from photoactive layer 108 because the valence band energy of hole transport layer 106 is substantially aligned with the valence band energy of photoactive layer 108. For example, in certain embodiments, the magnitude of the difference between the valence band energy of the photoactive layer and the valence band energy of the hole transport layer is about 1 eV or less, about 0.8 eV or less, about 0.6 eV or less, about 0.5 eV or less, about 0.4 eV or less, about 0.3 eV or less, about 0.25 eV or less, about 0.2 eV or less, about 0.15 eV or less, about 0.1 eV or less, or about 0.05 eV or less. In some cases, the magnitude of the difference between the valence band energy of the photoactive layer and the valence band energy of the hole transport layer is in the range of about 0.05 eV to about 0.1 eV, about 0.05 eV to about 0.2 eV, about 0.05 eV to about 0.3 eV, about 0.05 eV to about 0.4 eV, about 0.05 eV to about 0.5 eV, about 0.05 eV to about 1 eV, about 0.1 eV to about 0.2 eV, about 0.1 eV to about 0.3 eV, about 0.1 eV to about 0.4 eV, about 0.1 eV to about 0.5 eV, about 0.1 eV to about 1 eV, about 0.2 eV to about 0.3 eV, about 0.2 eV to about 0.4 eV, about 0.2 eV to about 0.5 eV, or about 0.2 eV to about 1 eV.

In some cases, hole transport layer 106 may facilitate transport of holes to anode 104 because the valence band energy of hole transport layer 106 is substantially aligned with the work function (e.g., minimum energy needed to remove an electron) of anode 104. For example, the magnitude of the difference between the work function of the anode and the valence band energy of the hole transport layer may be about 1 eV or less, about 0.8 eV or less, about 0.6 eV or less, about 0.5 eV or less, about 0.4 eV or less, about 0.3 eV or less, about 0.25 eV or less, about 0.2 eV or less, about 0.15 eV or less, about 0.1 eV or less, or about 0.05 eV or less. In some cases, the magnitude of the difference between the work function of the anode and the valence band energy of the hole transport layer is in the range of about 0.05 eV to about 0.1 eV, about 0.05 eV to about 0.2 eV, about 0.05 eV to about 0.3 eV, about 0.05 eV to about 0.4 eV, about 0.05 eV to about 0.5 eV, about 0.05 eV to about 1 eV, about 0.1 eV to about 0.2 eV, about 0.1 eV to about 0.3 eV, about 0.1 eV to about 0.4 eV, about 0.1 eV to about 0.5 eV, about 0.1 eV to about 1 eV, about 0.2 eV to about 0.3 eV, about 0.2 eV to about 0.4 eV, about 0.2 eV to about 0.5 eV, or about 0.2 eV to about 1 eV.

In certain embodiments, the hole transport layer may have relatively high hole mobility. For example, in some cases, the hole transport layer may have a hole mobility of at least about $10^{-6}$ cm$^2$/(V·s), at least about $10^{-5}$ cm$^2$/(V·s), at least about $10^{-4}$ cm$^2$/(V·s), at least about $10^{-3}$ cm$^2$/(V·s), at least about $10^{-2}$ cm$^2$/(V·s) at least about $10^{-1}$ cm$^2$/(V·s), at least about 1 cm$^2$/(V·s), or at least about 10 cm$^2$/(V·s) under an applied bias voltage in the range of about −0.5 V to about −10 V.

In some embodiments, hole transport layer 106 is also an electron blocking layer (e.g., layer 106 is a hole transport electron blocking layer). An electron blocking layer generally refers to a layer that inhibits electron transport between two or more layers of a device (e.g., a photodetector). For example, when photodetector 100 is in operation, hole transport electron blocking layer 106 may inhibit injection of electrons from anode 104 to photoactive layer 108. It has been recognized that it may be advantageous to inhibit injection of electrons from the anode to the photoactive layer because inhibiting such injection may reduce dark current (e.g., current that flows through the photodetector in the absence of absorption of electromagnetic radiation by the photoactive layer). Reducing dark current may advantageously result in an increase in detectivity of the photodetector.

In some cases, hole transport electron blocking layer 106 may inhibit injection of electrons from anode 104 to photoactive layer 108 under reverse bias because there is a substantially large gap between the work function of anode 104 and the conduction band energy of hole transport electron blocking layer 106. For example, the magnitude of the difference between the work function of the anode and the conduction band energy of the hole transport electron blocking layer may be at least about 0.5 eV, at least about 1 eV, at least about 1.5 eV, at least about 2 eV, at least about 2.5 eV, at least about 3 eV, at least about 4 eV, or at least about 5 eV. In some cases, the magnitude of the difference between the work function of the anode and the conduction band energy of the hole transport electron blocking layer is in the range of about 0.5 eV to about 1 eV, about 0.5 eV to about 1.5 eV, about 0.5 eV to about 2 eV, about 0.5 eV to about 2.5 eV, about 0.5 eV to about 3 eV, about 0.5 eV to about 4 eV, about 0.5 eV to about 5 eV, about 1 eV to about 2 eV, about 1 eV to about 2.5 eV, about 1 eV to about 3 eV, about 1 eV to about 4 eV, about 1 eV to about 5 eV, about 1.5 eV to about 2.5 eV, about 1.5 eV to about 3 eV, about 1.5 eV to about 4 eV, about 1.5 eV to about 5 eV, about 2 eV to about 3 eV, about 2 eV to about 4 eV, or about 2 eV to about 5 eV.

In some cases, the conduction band energy of the hole transport electron blocking layer may be relatively low. In certain cases, the magnitude of the conduction band energy of the hole transport electron blocking layer is about 3 eV or less, about 2.5 eV or less, about 2 eV or less, about 1.5 eV or less, about 1 eV or less, or about 0.5 eV or less. In some cases, the magnitude of the conduction band energy is in the range of about 0.5 eV to about 1 eV, about 0.5 eV to about 1.5 eV, about 0.5 eV to about 2 eV, about 0.5 eV to about 2.5 eV, about 0.5 eV to about 3 eV, about 1 eV to about 1.5 eV, about 1 eV to about 2 eV, about 1 eV to about 2.5 eV, about 1 eV to about 3 eV, about 1.5 eV to about 2 eV, about 1.5 eV to about 2.5 eV, about 1.5 eV to about 3 eV, about 2 eV to about 2.5 eV, or about 2.5 eV to about 3 eV.

Figure 2A:
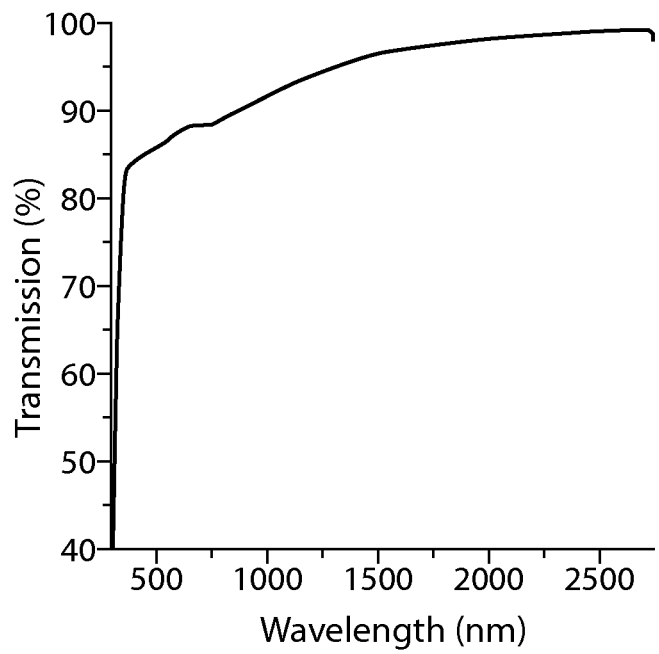
FIG. 2 shows transmission spectra (e.g., plots of transmission as a function of wavelength) for: A) a solution-deposited nickel oxide (NiO) layer, and B) a solution-deposited zinc oxide (ZnO) layer.

In certain embodiments, the hole transport (and, in some cases, electron blocking) layer comprises a p-type semiconducting metal oxide. A p-type semiconducting metal oxide generally refers to a metal oxide having a higher concentration of holes than electrons (e.g., the Fermi level lies closer to the valence band than the conduction band). In some embodiments, the p-type semiconducting metal oxide is a wide band-gap semiconductor (e.g., a semiconductor having a band gap larger than about 1 eV, about 1.5 eV). In an exemplary embodiment, the p-type semiconducting metal oxide is nickel oxide (NiO). NiO may have certain characteristics that have been recognized to be favorable, such as air stability and/or optical transparency. For example, as shown in FIG. 2A, a NiO layer has excellent optical transparency for thick deposited layers at an incident light energy that is less than the bulk band-gap energy. According to FIG. 2A, for a NiO layer, transmission is greater than 85% for wavelengths in the range of about 500 nm to about 2500 nm. For example, transmission is greater than 85% at a wavelength of 500 nm, and transmission is greater than 90% at a wavelength of 1 micron. In some embodiments, the p-type semiconducting metal oxide comprises copper oxide (CuO). The p-type semiconducting metal oxide may, in certain cases, be doped with one or more dopants. In some cases, the p-type semiconducting metal oxide may be deposited during fabrication of a photodetector by solution processes. In certain embodiments, the thickness of the p-type semiconducting metal oxide layer is in the range of about 10 nm to about 30 nm, about 10 nm to about 50 nm, about 10 nm to about 100 nm, about 30 nm to about 50 nm, about 30 nm to about 100 nm, or about 50 nm to about 100 nm.

In some embodiments, photodetector 100 may further comprise a hole extraction layer (not shown in FIG. 1A) positioned between anode 104 and hole transport layer 106. The hole extraction layer may, in some cases, enhance hole extraction and further facilitate transport of holes to anode 104. In certain cases, the hole extraction layer may comprise a highly n-type material. An n-type material generally refers to a material having a higher concentration of electrons than holes (e.g., the Fermi level lies closer to the conduction band than the valence band). In some cases, the hole extraction layer may have a large work function (e.g., a work function substantially similar to the work function of anode 104). Non-limiting examples of suitable materials for the hole extraction layer include molybdenum oxide (MoO$_3$), tungsten oxide (WO$_3$), and vanadium oxide (V$_2$O$_5$).

According to FIG. 1A, photodetector 100 may also comprise a layer 110 positioned adjacent photoactive layer 108 on the side distal to layer 106. In some embodiments, layer 110 comprises a second metal oxide (e.g., a second metal oxide layer). The second metal oxide layer may, in certain cases, be an electron transport layer. An electron transport layer generally refers to a layer that facilitates electron transport between two or more layers of a device (e.g., a photodetector). For example, when photodetector 100 is in operation, electron transport layer 110 may facilitate the transport of electrons from photoactive layer 108 to cathode 112. In some cases, electron transport layer 110 may facilitate transport of electrons from photoactive layer 108 because the conduction band energy of electron transport layer 110 is substantially aligned with the conduction band energy of photoactive layer 108. For example, in certain cases, the magnitude of the difference between the conduction band energy of the photoactive layer and the conduction band energy of the electron transport layer may be about 1 eV or less, about 0.8 eV or less, about 0.6 eV or less, about 0.5 eV or less, about 0.4 eV or less, about 0.3 eV or less, about 0.25 eV or less, about 0.2 eV or less, about 0.15 eV or less, about 0.1 eV or less, or about 0.05 eV or less. In some cases, the magnitude of the difference between the conduction band energy of the photoactive layer and the conduction band energy of the electron transport layer may be in the range of about 0.05 eV to about 0.1 eV, about 0.05 eV to about 0.2 eV, about 0.05 eV to about 0.3 eV, about 0.05 eV to about 0.4 eV, about 0.05 eV to about 0.5 eV, about 0.05 eV to about 1 eV, about 0.1 eV to about 0.2 eV, about 0.1 eV to about 0.3 eV, about 0.1 eV to about 0.4 eV, about 0.1 eV to about 0.5 eV, about 0.1 eV to about 1 eV, about 0.2 eV to about 0.3 eV, about 0.2 eV to about 0.4 eV, about 0.2 eV to about 0.5 eV, or about 0.2 eV to about 1 eV.

In some embodiments, electron transport layer 110 may facilitate electron transport to cathode 112 because the conduction band energy of the electron transport layer is substantially aligned with the work function of the cathode. For example, the magnitude of the difference between the work function of the cathode and the conduction band energy of the electron transport layer may be about 1 eV or less, about 0.8 eV or less, about 0.6 eV or less, about 0.5 eV or less, about 0.4 eV or less, about 0.3 eV or less, about 0.25 eV or less, about 0.2 eV or less, about 0.15 eV or less, about 0.1 eV or less, or about 0.05 eV or less. In some cases, the magnitude of the difference between the work function of the cathode and the conduction band energy of the electron transport layer may be in the range of about 0.05 eV to about 0.1 eV, about 0.05 eV to about 0.2 eV, about 0.05 eV to about 0.3 eV, about 0.05 eV to about 0.4 eV, about 0.05 eV to about 0.5 eV, about 0.05 eV to about 1 eV, about 0.1 eV to about 0.2 eV, about 0.1 eV to about 0.3 eV, about 0.1 eV to about 0.4 eV, about 0.1 eV to about 0.5 eV, about 0.1 eV to about 1 eV, about 0.2 eV to about 0.3 eV, about 0.2 eV to about 0.4 eV, about 0.2 eV to about 0.5 eV, or about 0.2 eV to about 1 eV.

In some embodiments, the electron transport layer may have relatively high electron mobility. For example, the electron transport layer may have an electron mobility of at least about $10^{-8}$ cm$^2$/(V·s), at least about $10^{-7}$ cm$^2$/(V·s), at least about $10^{-6}$ cm$^2$/(V·s), at least about $10^{-5}$ cm$^2$/(V·s), at least about $10^{-4}$ cm$^2$/(V·s), at least about $10^{-3}$ cm$^2$/(V·s), at least about $10^{-2}$ cm$^2$/(V·s), at least about $10^{-1}$ cm$^2$/(V·s), at least about 1 cm$^2$/(V·s), or at least about 10 cm$^2$/(V·s).

In some embodiments, the electron transport layer also acts as a hole blocking layer (e.g., layer 110 is an electron transport hole blocking layer). A hole blocking layer generally refers to a layer that inhibits hole transport between two or more layers of a device (e.g., a photodetector). For example, when photodetector 100 is in operation, electron transport hole blocking layer 110 may inhibit injection of holes from cathode 112 to photoactive layer 108. It has been recognized that it may be advantageous to inhibit injection of holes from the cathode to the photoactive layer, because inhibiting such injection may reduce dark current. Reducing dark current may advantageously result in an increase in detectivity of the photodetector.

In some cases, electron transport hole blocking layer 110 may inhibit injection of holes from cathode 112 to photoactive layer 108 under reverse bias because there is a substantially large gap between the work function of cathode 112 and the valence band energy of electron transport hole blocking layer 110. For example, the magnitude of the difference between the work function of the cathode and the valence band energy of the electron transport hole blocking layer may be at least about 0.5 eV, at least about 1 eV, at least about 1.5 eV, at least about 2 eV, at least about 2.5 eV, at least about 3 eV, at least about 4 eV, or at least about 5 eV. In some cases, the magnitude of the difference between the work function of the cathode and the valence band energy of the electron transport hole blocking layer is in the range of about 0.5 eV to about 1 eV, about 0.5 eV to about 1.5 eV, about 0.5 eV to about 2 eV, about 0.5 eV to about 2.5 eV, about 0.5 eV to about 3 eV, about 0.5 eV to about 4 eV, about 0.5 eV to about 5 eV, about 1 eV to about 2 eV, about 1 eV to about 2.5 eV, about 1 eV to about 3 eV, about 1 eV to about 4 eV, about 1 eV to about 5 eV, about 1.5 eV to about 2.5 eV, about 1.5 eV to about 3 eV, about 1.5 eV to about 4 eV, about 1.5 eV to about 5 eV, about 2 eV to about 3 eV, about 2 eV to about 4 eV, or about 2 eV to about 5 eV.

In some embodiments, the valence band energy of the electron transport hole blocking layer is relatively high. For example, the magnitude of the valence band energy of the electron transport hole blocking layer may be at least about 5 eV, at least about 5.5 eV, at least about 6 eV, at least about 6.5 eV, at least about 7 eV, at least about 7.5 eV, at least about 8 eV, at least about 9 eV, or at least about 10 eV. In some cases, the magnitude of the valence band energy is in the range of about 5 eV to about 6 eV, about 5 eV to about 7 eV, about 5 eV to about 8 eV, about 5 eV to about 9 eV, about 5 eV to about 10 eV, about 6 eV to about 7 eV, about 6 eV to about 8 eV, about 6 eV to about 9 eV, about 6 eV to about 10 eV, about 7 eV to about 8 eV, about 7 eV to about 9 eV, about 7 eV to about 10 eV, about 8 eV to about 9 eV, or about 8 eV to about 10 eV.

Figure 2B:
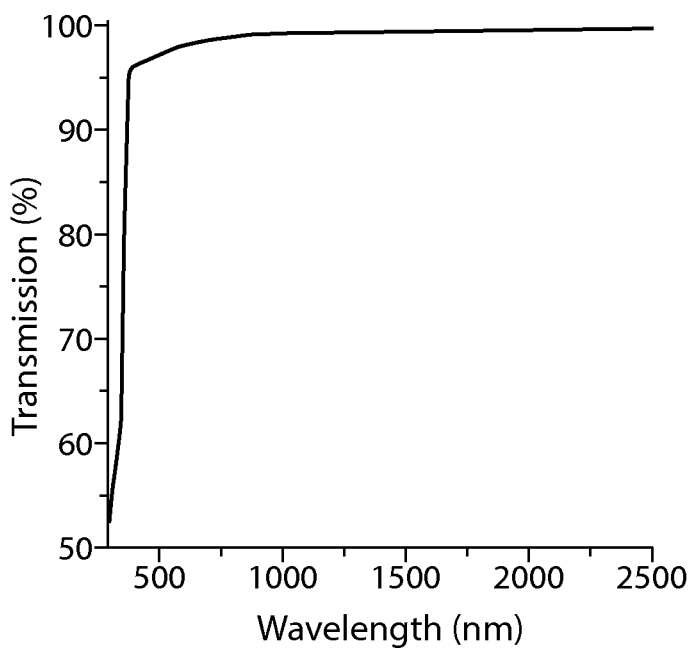

In some embodiments, the electron transport (and, in some cases, hole blocking) layer comprises an n-type semiconducting metal oxide. An n-type semiconducting metal oxide generally refers to a semiconducting metal oxide having a higher concentration of electrons than holes (e.g., the Fermi level lies closer to the conduction band than the valence band). Non-limiting examples of suitable n-type semiconducting metal oxides include zinc oxide (ZnO) and titanium dioxide (TiO$_2$). In some embodiments, these n-type semiconducting metal oxides are wide band-gap (e.g., at least about 1 eV, at least about 1.5 eV) semiconductors. In some embodiments, the n-type semiconducting metal oxides have certain characteristics that have been recognized to be favorable, such as air stability and/or optical transparency. For example, FIG. 2B shows an exemplary plot of transmission as a function of wavelength for a layer of ZnO, and it can be seen that for the ZnO layer, transmission is greater than 95% for wavelengths in the range of about 250 nm to about 2500 nm. The metal oxide layers can be formed as a film grown on a surface from precursors or as a deposition of a suspension of metal oxide nanoparticles. In some cases, the thickness of the metal oxide layers is in the range of about 10 nm to about 30 nm, about 10 nm to about 50 nm, about 10 nm to about 100 nm, about 30 nm to about 50 nm, about 30 nm to about 100 nm, or about 50 nm to about 100 nm. These metal oxide layers can provide an encapsulation of the photoactive layer that provides air stability to the device.

In some cases, the photodetector has a standard architecture, as shown in FIG. 1A. For photodetector 100 having a standard architecture, substrate 102 may comprise a material that is sufficiently transparent to the electromagnetic radiation to be detected by photoactive layer 108 (e.g., infrared and/or visible radiation). Examples of suitable materials for substrate 102 include ridged or flexible glass or quartz, or organic polymers, provided that the organic polymers are sufficiently transparent to infrared and/or visible radiation. In this standard architecture, anode 104 may be deposited on substrate 102. Anode 104 may also be transparent to the electromagnetic radiation to be detected. For example, anode 104 may comprise ITO or any other transparent conductive oxide with a large work function (e.g., near the valence band of the hole transport layer), such that good contact can be provided with hole transport layer 106. Cathode 112, however, may not necessarily be transparent to the electromagnetic radiation to be detected. In some embodiments, cathode 112 may have certain advantageous properties, such as a comparatively low work function (e.g., near the conduction band of the electron transport layer) and high reflectivity. Non-limiting examples of suitable materials for cathode 112 include aluminum and silver.

Figure 1B:
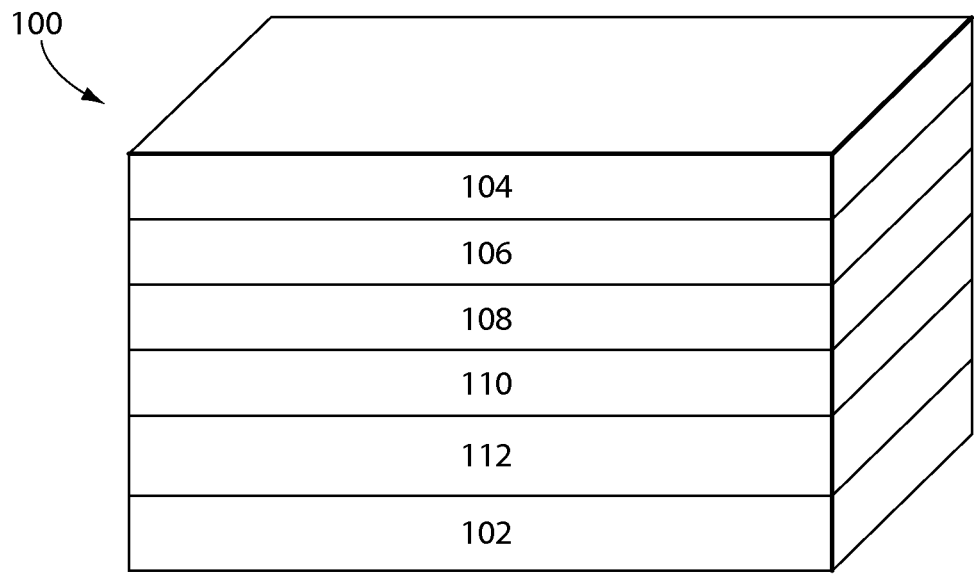

Alternatively, in some embodiments, the photodetector has an inverted architecture. An exemplary schematic illustration of a photodetector having an inverted architecture is shown in FIG. 1B. In FIG. 1B, photodetector 100 is a multi-layered structure including a substrate 102, a cathode 112, an electron transport layer 110, a photoactive layer 108, a hole transport layer 106, and an anode 104. In the inverted architecture, cathode 112 is positioned adjacent substrate 102. In the inverted architecture, cathode 112 may therefore be transparent to the electromagnetic radiation to be detected by photoactive layer 108. Non-limiting examples of suitable materials for the cathode include calcium, aluminum, and silver. Conversely, anode 102 may not necessarily be transparent to the electromagnetic radiation. In some cases, anode 102 may comprise a metal. Non-limiting examples of suitable materials for anode 102 in the inverted architecture include silver, gold, and platinum. Anode 102 may also comprise ITO or any other transparent conductive oxide with a large work function.

In some embodiments, the photodetectors comprise an optional optical filter. The optical filter can be placed on the light entry face of the photodetector to provide selection of the wavelengths to be detected, or to further enhance the stability of the photodetector. For example, at least a portion of UV radiation can be blocked by inclusion of a long-pass filter that blocks UV-A (350-400 nm) radiation, which can have deleterious effects on PbS quantum dots.

In certain cases, the photodetectors described herein have certain properties that have been recognized as being advantageous. For example, the photodetectors may be air stable. Air stability may generally be determined by periodically measuring the performance of a photodetector exposed to air over time. For example, suitable metrics of performance include, but are not limited to, external quantum efficiency (EQE), responsivity, and specific detectivity. EQE may generally refer to the ratio of the number of free charge carriers generated to the number of incident photons on the photodetector. Responsivity may generally refer to a measure of electrical output (e.g., photocurrent) per optical input. Specific detectivity may generally refer to a figure of merit relating to the sensitivity of a photodetector, which it may be expressed using the following equation (1):

$$D^* = \frac{R\sqrt{A}\sqrt{B}}{(2qI_d)^{\frac{1}{2}}} \quad (1)$$

where R is responsivity, A is device area, B is bandwidth, $I_d$ is dark current density, and q is elementary charge ($1.6 \times 10^{-19}$ C). As used herein, an air-stable photodetector may refer to a photodetector that, upon exposure to air, has a measured performance metric that has a relative standard deviation of about 50% or less, about 20% or less, about 10% or less, about 5% or less, or about 1% or less over a certain a period of time. In some embodiments, the air stable photodetector has a measured performance metric that has a relative standard deviation in the range of about 1% to about 5%, about 1% to about 10%, about 1% to about 20%, about 1% to about 50%, about 5% to about 20%, about 5% to about 50%, about 10% to about 20%, or about 10% to about 50%. In some embodiments, the period of time is at least about 1 day, at least about 10 days, at least about 30 days, at least about 60 days, at least about 90 days, at least about 120 days, at least about 240 days, at least about 1 year, at least about 5 years, or at least about 10 years. The period of time may be in the range of about 1 day to about 30 days, about 1 day to about 60 days, about 1 day to about 90 days, about 1 day to about 120 days, about 1 day to about 240 days, about 1 day to about 1 year, about 1 day to about 5 years, about 1 day to about 10 years, about 30 to about 60 days, about 30 to about 90 days, about 30 to about 120 days, about 30 days to about 1 year, about 60 days to about 120 days, about 60 days to about 1 year, about 60 days to about 5 years, about 60 days to about 10 years, about 90 days to about 120 days, about 90 days to about 1 year, about 90 days to about 5 years, about 90 days to about 10 years, about 120 days to about 1 year, about 120 days to about 5 years, about 120 days to about 10 years, about 365 days to about 5 years, about 365 days to about 10 years, or about 5 years to about 10 years. In some cases, the photodetectors are air stable in the absence of an external encapsulating coating (i.e., other than the first and second metal oxide layers). The property of being air stable in the absence of an external encapsulating coating may advantageously facilitate fabrication and storage of the photodetectors and reduce costs.

In some embodiments, the photodetectors exhibit other characteristics that have been recognized as being advantageous. For example, the photodetectors may have a relatively fast response speed (e.g., a rise time of less than about 10 μs) and/or a relatively large bandwidth (e.g., at least about 10 kHz, at least about 15 kHz). In certain cases, response speed may increase (e.g., rise time may decrease) and bandwidth may increase with increasing magnitude of an applied reverse bias voltage. In some cases, the photodetectors have a relatively low noise current spectral density (e.g., about $10^{23}$ A$^2$/Hz or less) under reverse bias. In certain embodiments, the photodetectors have a high spectral responsivity. For example, in certain cases, the photodetectors have a responsivity of at least about 0.1 ampere/watt (A/W), at least about 0.2 A/W, or at least about 0.3 A/W for wavelengths in the range of about 400 nm to about 1300 nm. In some cases, the photodetectors have a responsivity of at least about 0.1 A/W, at least about 0.2 A/W, or at least about 0.3 A/W for wavelengths in the range of about 400 nm to about 1300 nm under an applied reverse bias voltage of at least about −1 V, at least about −2 V, or at least about −3 V. In some cases, the photodetector may have a relatively low dark current (e.g., about 1 nanoampere or less) under an applied reverse bias voltage of at least about 0 V, at least about −1 V, at least about −2 V, at least about −5 V, or at least about −10 V.

In some embodiments, the photodetectors described herein exhibit high specific detectivity. High specific detectivities may result from a combination of extremely low noise current, large bandwidth, and high spectral responsivity. In some cases, the photodetectors have a specific detectivity of at least about $5\times10^{11}$ Jones, at least about $1\times10^{12}$ Jones, or at least about $2\times10^{12}$ Jones for a wavelength of at least about 400 nm, at least about 600 nm, at least about 800 nm, at least about 1 µm, at least about 1.2 µm, or at least about 2 µm. In certain embodiments, the photodetectors have a specific detectivity of at least about $5\times10^{11}$ Jones, at least about $1\times10^{12}$ Jones, or at least about $2\times10^{12}$ Jones for a wavelength of at least about 400 nm, at least about 600 nm, at least about 800 nm, at least about 1 µm, at least about 1.2 µm, or at least about 2 µm under a reverse bias voltage of at least about −1 V, at least about −2 V, or at least about −3 V.

Certain embodiments relate to methods of fabricating photodetectors. In some cases, the photodetectors may be fabricated using solution processes. The use of solution processes may advantageously lower fabrication costs and/or allow integration with flexible electronics. According to an embodiment of the invention, solutions of metal oxide precursors or suspensions of nanoparticles, for example nanoparticles of the first or second metal oxide layers or of the photoactive layer are deposited using, for example, spin-coating, spray-casting, or inkjet printing techniques. Upon deposition of a first metal oxide layer on an electrode, the layer can be stabilized. The inorganic nanoparticles of the photoactive layer can then be deposited and modified, if desired. The second metal oxide can subsequently be deposited on the photoactive layer. The depositions of each layer can be as a single deposition, or by the repeated deposition of portions of the ultimate layer. In some embodiments, a layer (e.g., a photoactive layer) may comprise 5, 10, 15, 20, 25, or 30 depositions of nanoparticle layers. After deposition of each layer, the device with an exposed layer can be heated, extracted, ligand exchanged, or otherwise treated to achieve a stable desired structure prior to subsequent deposition of an additional layer. For example, in some cases, ligand exchange may "cross-link" the nanoparticles to increase conductivity of a layer. The solution derived metal oxides can reduce reverse bias dark current and provide air stability in addition to allowing a facile, high throughput fabrication of photodetectors of small or large area. The solvents are typically selected to achieve all compatibility requirements, permit their removal when desired, and to not provide any undesired optical or electrical properties.

Example

This Example describes fabrication of layers in a broadband multispectral photodetector comprising a PbS quantum dot photoactive layer, a NiO hole transport electron blocking layer, and a ZnO electron transport hole blocking layer. The Example also illustrates the resulting advantageous properties of the photodetector.

NiO Layer Preparation

A NiO precursor solution is prepared where a 0.1 M solution of nickel acetate in ethanol is combined with ethanolamine in a 1:1 mole ratio. The NiO precursor solution is spin coated on the anode and heated in air for one hour. The temperature of heating can be 275° C. to 500° C. or more to give a continuous film of the NiO.

PbS Quantum Dot Layer

A 1 M solution of hexamethyldisilathiane ((TMS)$_2$S) in octadecane is injected into a vigorously stirred 0.004 M solution of lead oxide in octadecane and oleic acid at a temperature of 110° C. and 150° C. After 3-5 minutes the reaction is quenched by the addition of chilled isopropanol. After quenching, colloidal PbS is precipitated and washed three times in a centrifuge with a non-solvent, such as acetone. The PbS nanoparticles are dispersed in toluene, followed by drying. Suspensions of the quantum dots are prepared for device fabrication with concentrations chosen to achieve a desired film layer thickness. Different sized quantum dots having different absorption spectra are prepared by controlling the reaction temperature and time between injection and quenching. PbS nanoparticles with first excitonic absorption peaks between 1000 and 1500 nm are readily produced. Quasi-spherical quantum dots of approximately 6 nm diameters are prepared with an absorption tail extending through the visible range. These quantum dots are appropriate for the broadband multispectral photodetectors characterized below. FIG. 3 indicates the responsivity of the 6 nm-diameter quantum dots, which indicates absorption from 400 through 1300 nm. Quantum dots ranging from about 4 nm to about 10 nm in diameter are readily synthesized by this procedure.

The photoactive layer, as shown in FIG. 4, is prepared by spin-coating a 5 mg/mL suspension of PbS quantum dots in chloroform or hexane onto the NiO layer. The oleic acid ligands are exchanged with 1,3-benzenedithiol ligands by dipping the intermediate device into a solution of 1,3-benzenedithiol in acetonitrile. Ligand exchange "cross-links" the nanoparticles to increase conductivity of the layer. Layer deposition and ligand exchange are repeated up to thirty times to increase the thickness of the photoactive layer.

ZnO Nanoparticle Layer

A 10 M solution of tetramethylammonium hydroxide pentahydrate (TMAH) in dimethyl sulfoxide (DMSO) is added to a 10 M solution of zinc acetate dihydrate in ethanol with vigorous stirring for one hour. Colloidal ZnO nanoparticles with a diameter of approximately 6 nm are formed. The ZnO nanoparticles, which are shown in FIG. 5, are repeatedly dispersed, washed, and centrifuged. The colloidal ZnO nanoparticles are dispersed in ethanol and spin-coated directly onto the photoactive layer and baked at 80° C. for ten minutes to dry the ZnO layer. The ZnO nanoparticles make intimate contact with the like sized porous PbS film.

Photodetector Characterization

For the photodetector comprising a photoactive layer formed from various numbers of 6 nm PbS quantum dot depositions, the dark current of the diode in reverse bias is found to be on the order of 1 nanoampere, as shown in FIG. 6. This indicates favorable photodetector levels with proper current rectification that reflects the p-type nature of the NiO and n-type nature of ZnO. The spectral photoresponse, shown in FIG. 3, indicates the photodetectors have a broad absorption region, extending from the near infrared through the visible portions of the electromagnetic spectrum (e.g., from about 400 nm to about 1300 nm).

FIG. 7 shows the speed and bandwidth of the 20 layer PbS photodetectors of FIG. 3. The bandwidth of these detectors is on the order of 10 kHz, which is well above that required of conventional imaging sensors. Bandwidth optical measurements are conducted with an in-house pulsed LED setup (Thorlabs). The setup consists of an LED driven by a function generator with a square voltage pulse. The device's current output is amplified by a Stanford SR570 current preamplifier in high bandwidth mode and is read by a digital oscilloscope on one channel, while the LED driver is monitored by another channel.

FIG. 8 shows the noise current spectral density measured for the 20 layer PbS photodetector and the 1/f fit and shot noise, where the noise characteristics include a low corner frequency with the noise depending on the bias applied to the photodetector during measurement. For noise measurement, devices are packaged and bonded inside a small aluminum Faraday cage and placed inside a solid copper Faraday cage with an SR570 current preamplifier (electrically isolated) which acts as a bias source and amplifier. The solid aluminum and copper boxes shield the devices and amplifier from outside noise. The SR570 amplifier is then connected to an Agilent 35670A Dynamic Signal Analyzer spectrum analyzer, and the spectrum analyzer outputs the signal directly to a data acquisition setup.

FIG. 9 shows the calculated specific detectivity for the PbS photodetectors. High detectivities, of the order $10^{12}$, result from a combination of extremely low noise current, large bandwidth and high spectral responsivity. Specific detectivity is obtained using an in-house setup consisting of a Xenon DC arc lamp, an ORIEL 74125 monochromator, a Keithley 428 current amplifier, an SR 540 chopper system at 270 Hz, and an SR830 DSP lock-in amplifier from SRS.

These photodetectors kept in air without encapsulation displayed no apparent loss in performance, with apparent stability for more than 3 months, as is shown in FIG. 10. Specific detectivity is determined using the following approximation for total noise current: $\langle i^2 \rangle = 2qI_{dark}$. This expression is first used to calculate the noise equivalent power (NEP) using the following expression: $NEP = \sqrt{\langle i^2 \rangle}/R$ where R is the spectral responsivity. Specific detectivity D* is then calculated using the expression:

$$D^* = \frac{\sqrt{A}\sqrt{B}}{NEP},$$

where A is the device area and B is the bandwidth.

All patents, patent applications, provisional applications, and publications referred to or cited herein are incorporated by reference in their entirety, including all figures and tables, to the extent they are not inconsistent with the explicit teachings of this specification.

It should be understood that the examples and embodiments described herein are for illustrative purposes only and that various modifications or changes in light thereof will be suggested to persons skilled in the art and are to be included within the spirit and purview of this application.

We claim:

1. A photodetector, comprising:
   a photoactive layer comprising semiconducting inorganic nanoparticles of a first size; a hole transport layer comprising a first metal oxide; and
   an electron transport layer comprising nanoparticles of a second metal oxide having a second size that matches the first size,
   wherein the semiconducting inorganic nanoparticles are responsive to electromagnetic radiation in at least the infrared region of the spectrum, wherein the photoactive layer is positioned between the hole transport layer and the electron transport layer, and is in direct contact with the electron transport layer, wherein the photodetector is stable in air in the absence of an external encapsulating coating.

2. The photodetector of claim 1, wherein the photodetector has an external quantum efficiency having a relative standard deviation of less than about 5% over a period of at least about 120 days, wherein the photodetector is exposed to air during the period.

3. The photodetector of claim 1, wherein the hole transport layer is a hole transport electron blocking layer.

4. The photodetector of claim 1, wherein the electron transport layer is an electron transport hole blocking layer.

5. The photodetector of claim 1, wherein the first metal oxide is NiO.

6. The photodetector of claim 1, wherein the second metal oxide is ZnO.

7. The photodetector of claim 1, wherein the second metal oxide is $TiO_2$.

8. The photodetector of claim 1, wherein the semiconducting inorganic nanoparticles comprise lead chalcogenides, alloys of lead chalcogenides, mercury chalcogenides, alloys of mercury chalcogenides, III-V semiconductors based on indium and/or gallium, silicon, or any combination thereof.

9. The photodetector of claim 1, wherein the semiconducting inorganic nanoparticles comprise PbS or PbSe.

10. The photodetector of claim 9, wherein the hole extraction layer comprises molybdenum oxide ($MoO_3$), tungsten oxide ($WO_3$), and/or vanadium oxide ($V_2O_5$).

11. The photodetector of claim 1, wherein the semiconducting inorganic nanoparticles are responsive to electromagnetic radiation in the visible and infrared regions of the electromagnetic spectrum.

12. The photodetector of claim 1, further comprising a hole extraction layer.

13. The photodetector of claim 1, further comprising an optical filter on a light incident face of the photodetector.

14. The photodetector of claim 13, wherein the optical filter removes at least a portion of the electromagnetic radiation in the ultraviolet regions of the electromagnetic spectrum.

15. A method of preparing a photodetector comprising a photoactive layer comprising semiconducting inorganic nanoparticles, a hole transport layer comprising a first metal oxide, an electron transport layer comprising a second metal oxide, wherein the semiconducting inorganic nanoparticles are responsive to electromagnetic radiation in at least the infrared region of the spectrum, wherein the photoactive layer is positioned between the hole transport layer and the electron transport layer, and is in direct contact with the electron transport layer, wherein the photodetector is stable in air in the absence of an external encapsulating coating, the method comprising:
   providing a substrate comprising an electrode;
   depositing a first solution of a first metal oxide precursor or a first suspension of a plurality of metal oxide particles on the electrode;
   removing the solvent from the first solution or first suspension to form a first layer comprising the first metal oxide;
   depositing a colloidal suspension of semiconducting inorganic nanoparticles on the first layer;
   removing the solvent from the colloidal suspension of semiconducting inorganic quantum dots to form a photoactive layer comprising semiconducting inorganic quantum dots;

depositing a second solution of a second metal oxide precursor or a second suspension of a plurality of metal oxide particles on the photoactive layer; and removing the solvent from the second solution or second suspension to form a second layer comprising the second metal oxide.

16. The method of claim 15, wherein the electrode is an anode, the first layer comprising a first metal oxide is a hole transport electron blocking layer, and the second layer comprising a second metal oxide is an electron transport hole blocking layer.

17. The method of claim 16, wherein the hole transport electron blocking layer comprises NiO.

18. The method of claim 16, wherein the electron transport hole blocking layer comprises ZnO and/or $TiO_2$.

19. The method of claim 15, wherein the electrode is a cathode, the first layer comprising a first metal oxide is an electron transport hole blocking layer, and the second layer comprising a second metal oxide is a hole transport electron blocking layer.

20. The method of claim 19, wherein the hole transport electron blocking layer comprises NiO.

21. The method of claim 19, wherein the electron transport hole blocking layer comprises ZnO and/or $TiO_2$.

22. The method of claim 15, further comprising the step of modifying the first layer comprising the first metal oxide, the second layer comprising the second metal oxide, and/or the photoactive layer chemically or thermally.

23. The method of claim 22, wherein modifying the first layer comprising the first metal oxide, the second layer comprising the second metal oxide, and/or the photoactive layer chemically comprises ligand exchanging.

24. The method of claim 15, wherein the method does not further include a step of encapsulating the photodetector.

25. The method of claim 15, further comprising exposing the photodetector to air for a period of time, wherein the performance of the photodetector is stable during the period of time.

26. The method of claim 25, wherein the period of time is at least about 120 days.

27. The method of claim 25, wherein the photodetector has an external quantum efficiency having a relative standard deviation of less than about 5% during the period of time.

* * * * *

UNITED STATES PATENT AND TRADEMARK OFFICE
CERTIFICATE OF CORRECTION

PATENT NO. : 9,985,153 B2
APPLICATION NO. : 14/915426
DATED : May 29, 2018
INVENTOR(S) : Franky So et al.

It is certified that error appears in the above-identified patent and that said Letters Patent is hereby corrected as shown below:

On the Title Page

The Inventors item (72), the fourth named inventor, Erik D. Klump, Gainesville, FL (US) should be corrected to appear as follows:
Erik D. Klump, Garner, NC (US)

The Inventors item (72), the fifth named inventor, Tzhung-Han Lai, Gainesville, FL (US) should be corrected to appear as follows:
Tzung-han Lai, Gainesville, FL (US)

Signed and Sealed this
Twenty-first Day of August, 2018

Andrei Iancu
*Director of the United States Patent and Trademark Office*